(12) United States Patent
Milicevic et al.

(10) Patent No.: US 8,859,057 B2
(45) Date of Patent: Oct. 14, 2014

(54) DEVICE FOR APPLYING ELECTROMAGNETIC MICROWAVE RADIATION IN A PLASMA INSIDE A HOLLOW GLASS SUBSTRATE TUBE, AND METHOD FOR MANUFACTURING AN OPTICAL PREFORM

(71) Applicant: Draka Comteq B.V., Amsterdam (NL)

(72) Inventors: Igor Milicevic, Helmond (NL); Mattheus Jacobus Nicolaas Van Stralen, Tilburg (NL); Johannes Antoon Hartsuiker, Eindhoven (NL)

(73) Assignee: Draka Comteq B.V. (NL)

( * ) Notice: Subject to any disclaimer, the term of this patent is extended or adjusted under 35 U.S.C. 154(b) by 27 days.

(21) Appl. No.: 13/688,465

(22) Filed: Nov. 29, 2012

(65) Prior Publication Data

US 2013/0142964 A1    Jun. 6, 2013

(30) Foreign Application Priority Data

Dec. 1, 2011   (NL) ...................................... 2007917

(51) Int. Cl.
*H05H 1/24* (2006.01)
*H01J 37/32* (2006.01)
*C03B 37/018* (2006.01)

(52) U.S. Cl.
CPC ............ *H05H 1/24* (2013.01); *H01J 37/32394* (2013.01); *H01J 37/32192* (2013.01); *C03B 37/0183* (2013.01)
USPC .............. 427/575; 427/58; 427/230

(58) Field of Classification Search
None
See application file for complete search history.

(56) References Cited

U.S. PATENT DOCUMENTS

| 4,125,389 A | 11/1978 | King |
| 4,844,007 A | 7/1989 | Eikelboom |
| 5,223,308 A | 6/1993 | Doehler |
| 6,849,307 B2 * | 2/2005 | Breuls et al. .................. 427/575 |
| 7,650,853 B2 | 1/2010 | Van Stralen et al. |
| 2003/0104139 A1 | 6/2003 | House et al. |
| 2003/0115909 A1 | 6/2003 | House et al. |
| 2003/0159781 A1 * | 8/2003 | Van Stralen et al. ..... 156/345.41 |
| 2004/0045508 A1 | 3/2004 | Tamagaki |
| 2007/0289532 A1 * | 12/2007 | Hartsuiker et al. .... 118/723.001 |

FOREIGN PATENT DOCUMENTS

EP    1867 610 A1    12/2007

OTHER PUBLICATIONS

Dutch Search Report dated Jul. 3, 2012 for Dutch Patent Application No. 2007917.

* cited by examiner

*Primary Examiner* — Joseph Miller, Jr.
(74) *Attorney, Agent, or Firm* — Shumaker, Loop & Kendrick, LLP

(57) ABSTRACT

A device for applying electromagnetic microwave radiation in a plasma inside a substrate tube including inner and outer cylindrical walls defining an annular cavity therebetween, the inner wall having a circumferential applicator slit, an elongate microwave guide arranged with a first end in communication with the annular cavity and a second end in communication with a microwave generating means for supplying microwaves to the annular cavity, and means for supplying a cooling gas through the elongate microwave guide to a position near the applicator slit.

6 Claims, 1 Drawing Sheet

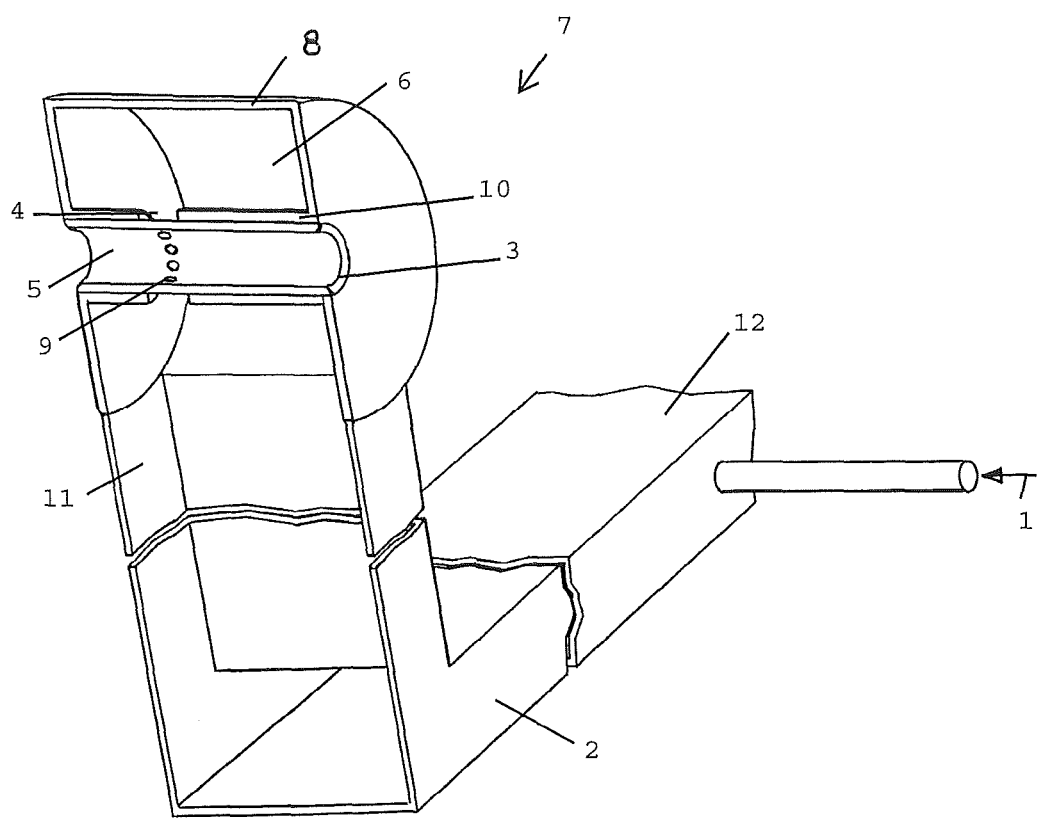

DEVICE FOR APPLYING ELECTROMAGNETIC MICROWAVE RADIATION IN A PLASMA INSIDE A HOLLOW GLASS SUBSTRATE TUBE, AND METHOD FOR MANUFACTURING AN OPTICAL PREFORM

CROSS-REFERENCE TO RELATED APPLICATION

This new U.S. patent application claims priority to Dutch Patent Application No. NL 2007917 filed Dec. 1, 2011, the entirety of which is incorporated by reference herein.

TECHNICAL FIELD AND BACKGROUND OF THE INVENTION

The invention relates to a device for applying electromagnetic microwave radiation in a plasma inside a hollow glass substrate tube. The device generally includes an annular space enclosed by a metal wall, and further includes an input port and an applicator slit, the applicator slit being an output port acting as a radial waveguide, wherein, at the input port, a first end of an elongated microwave guide is attached. The microwave guide is in communication with microwave generating means via a second end of the microwave guide.

The invention further relates to a method for manufacturing an optical fibre preform using the device for applying electromagnetic microwave radiation, and an optical fibre obtained from the optical fibre preform.

A device for applying electromagnetic microwave radiation in a plasma cavity is disclosed in U.S. Pat. No. 7,650,853, which is from the same inventors. U.S. Pat. No. 7,650,853 relates to the provision of a microwave applicator by means of which a stable plasma having favorable geometric properties can be generated and maintained, which microwave radiation has only one electromagnetic field distribution at least in one direction perpendicular to the propagation direction.

European Patent 1 867 610 in the name of the present inventors discloses an apparatus for carrying out a Plasma Chemical Vapour Deposition (PCVD) deposition process, wherein in a coaxial waveguide an antenna is movable, wherein the antenna bisects a feed waveguide and a guide element is present in the interior of the feed waveguide.

U.S. Pat. No. 5,223,308 discloses a deposition apparatus that includes a microwave generator, wherein a rectangular microwave waveguide is used for generating an electromagnetic field of intense microwave energy in a space in which an elongated hollow tube is moved continuously. Such a tube is formed of a synthetic resin, for example a nylon material, wherein a coating of silicon oxide, silicon nitride or silicon oxycarbide is applied by means of the aforesaid apparatus, which tubes are used as pipes for the hydraulic air conditioning system in automobiles in order to minimize the loss of liquid coolant, for example freon, into the atmosphere.

U.S. 2003/0104139 relates to an apparatus for depositing a PCVD coating on the interior of a hollow glass tube, wherein an applicator includes a waveguide and an applicator head is used, wherein the waveguide functions to guide microwaves from a microwave generator to the applicator head. The waveguide has an elongated axis and a rectangular cross-section having a long axis and a short axis arranged perpendicular to the elongated axis of the waveguide. A glass tube is positioned within the applicator head, and the applicator head is moved over the hollow glass tube, where a coating is to be deposited, along the longitudinal axis of the tube.

U.S. 2003/0115909 relates to an apparatus for depositing one or more glass layers on the interior of a hollow substrate tube, wherein an activator space of a microwave applicator surrounds the hollow substrate tube, with the microwaves generating a plasma in the interior of the hollow substrate tube causing the glass-forming precursors to deposit $SiO_2$ onto the interior of the substrate tube.

U.S. 2004/0045508 relates to a plasma-activated CVD system in which a cooler for cooling the annular waveguide is provided, whereby it is intended to protect the annular waveguide from heat and attain a safe and stable supply of the microwave. The cooler is disposed between the annular waveguide and the quartz tube as the reaction chamber, i.e. a cooling pipe for passing therethrough a refrigerant such as water, oil, or gas is mounted to an inner surface of the inner periphery wall of the annular waveguide, thereby constituting the cooler. The cooling pipe is embedded in the inner periphery wall of the annular waveguide.

U.S. Pat. No. 4,125,389 relates to a method of manufacturing an optical fibre by plasma activated deposition in a tube, and to an apparatus for such a method, in which a substrate tube of fused silica is placed through a microwave cavity connected to a high power microwave generator by a waveguide. Gas is fed through the tube and cooling gas is passed along the outside of the tube, in the microwave cavity, as a cooling gas such as nitrogen is passed between the metal cavity and the outside wall of the tube.

U.S. Pat. No. 4,844,007 relates to a device for providing glass layers on the inside of a tube including a gas supply device that is connected to one end of the tube, a furnace for heating the tube, a resonator including a resonant cavity for generating a plasma in the tube, and means to move the resonator and the tube relative to each other, a high-frequency generator connected to the resonant cavity and a vacuum pump connected to the opposite end of the glass tube. The resonator includes a cooled body having a duct for receiving the tube, of which body at least the duct wall consists of a readily heat-conducting metal and in which the wall of the duct facing the tube is provided with a heat-insulating layer. The cooling capacity of the resonator is reduced by the presence of the heat-insulating layer and the resonator is cooled via cooling water ducts.

An apparatus for manufacturing optical fibres is disclosed in U.S. Pat. No. 6,849,307, which is from the same inventors. The apparatus may be used within the context of manufacturing from which an optical fibre can be drawn. According to the method for manufacturing such a preform, an elongated vitreous substrate tube, made of quartz for example, is coated on its interior cylindrical surface with layers of doped silica, for example germanium-doped silica. This can be achieved by positioning the substrate tube along the cylindrical axis of a reaction zone and flushing the interior of the tube with a gaseous mixture, for example $O_2$, $SiCl_4$ and possible dopants, e.g. $GeCl_4$. Localized plasma is concurrently generated within a cavity, causing the reaction of Si, O and Ge so as to effect direct deposition of Ge-doped $SiO_2$ on the interior surface of the substrate tube. Since such deposition only occurs in the vicinity of the localized plasma, the reaction zone must be swept along the cylindrical axis of the tube in order to uniformly coat the whole length of the tube. When coating is complete, the tube is thermally collapsed into a massive solid rod having a Ge-doped silica core portion and a surrounding undoped silica cladding portion. If an extremity of the rod is heated so that it becomes molten, a thin glass fibre can be drawn from the rod and wound on a reel, with the fibre having a core and cladding portion corresponding to those of the rod. Because the Ge-doped core has a higher refractive index than the undoped cladding, the fibre can function as a waveguide for optical signals, for example for use in propagating optical telecommunication signals. The gaseous mixture flushed through the hollow glass substrate tube may contain other components and dopants, for example $C_2F_6$ causes a reduction in the refractive index of the doped silica. The solid preform may be placed in a "jacket tube" made of undoped silica prior to the drawing procedure in order to increase the quantity of undoped silica relative to doped silica in the final fibre. Another possibility is to apply an extra amount of silica to the "overcladding" by means of a plasma process or outside vapour deposition (OVD) process.

The use of such an optical fibre for telecommunication purposes requires that the optical fibre be substantially free from defects such as discrepancies in the percentage of dopants, undesirable cross-sectional ellipticity, and the like, because, when considered over a large length of the optical fibre, such defects may cause a significant attenuation of the signal being transported. It is important, therefore, to realize a very uniform and reproducible PCVD process because the quality of the deposited PCVD layers ultimately determines the quality of the optical fibres. Thus, it is important that the plasma generated in the resonant cavity be rotationally symmetrical around the cylindrical axis of the cavity. On the other hand, the costs of the production process will be advantageously affected if the preform can be given a larger diameter, since larger fibre lengths can then be obtained from a single preform. Increasing the diameter of the resonant cavity enables the use of substrate tubes having increased diameters, however leads to a plasma having a deteriorated rotational symmetry, and such can only be generated by using much higher microwave power.

In the aforesaid PCVD apparatus, energy from a device capable of generating microwaves, for example a microwave oven, must be transferred to the annular resonant cavity so as to form a plasma zone in the interior of the substrate tube. This means that the microwaves are supplied to the feed waveguide and can subsequently reach the annular resonant cavity via a waveguide.

The present inventors have found that using high doped hollow substrate tubes may cause problems during the inside deposition process of the plasma type. Examples of problems that may occur are related to melting of the substrate tube, or a partial premature collapse of the substrate tube during the inside deposition phase. These problems require an early termination of the deposition process, and are highly undesirable form the viewpoint of process stability and safety. While one solution to these problems is a lower furnace temperature, lowering the furnace temperature can disadvantageously lead to the deposition of lower quality glass layers.

BRIEF SUMMARY OF THE INVENTION

In one aspect, the present invention is directed to a device for carrying out a plasma chemical vapour deposition (PCVD) process, wherein the apparatus enables employing high doped substrate tubes for attaining high deposition rates.

In another aspect, a device for carrying out a PCVD process is provided herein in which the deposition of high quality glass layers is ensured.

In yet another aspect, a device for carrying out a PCVD process is provided herein in which high furnace temperatures are applied during the inside deposition of glass layers in the interior of a hollow substrate tube.

In yet another aspect, the device for carrying out a PCVD process includes means for cooling at a position near the applicator slit.

With the means for cooling at a position near the applicator slit, excessive heating of the substrate tube is prevented. This arrangement allows the use of high doped substrate tubes in a PCVD process. When the outside temperature of the hollow substrate tube inside the resonator is kept below its melting point, the substrate tube remains in its original state, that is, no sagging or melting occurs. Heating of the substrate tube can occur due to the dissipation of the plasma energy on the inside of the substrate tube.

In a particular embodiment, the means for cooling includes means for directing a flow of cooling gas through the interior of the elongated microwave guide. The elongated microwave guide can thus be used for transporting cooling gas in an efficient way, and the transport of cooling gas lowers the outside temperature of the substrate tube, especially at the location where the heating of the substrate tube is the most significant during the inside deposition process. One example of a cooling gas can be compressed air.

In one embodiment, the annular space is substantially symmetrical about an axis, i.e. the longitudinal axis of the hollow substrate tube when inserted in the device. Such a symmetrical construction is preferred from a view point of stable microwaves inside the substrate tube.

According to another embodiment, a hollow quartz glass liner tube is located against an inner cylindrical wall of the device, and inside an area enclosed by the annular space, the hollow quartz glass liner tube is provided with one or more openings. The liner tube prevents the unwanted adhesion of small fragments coming from the furnace wall and the resonator itself. During the deposition process, the hollow substrate tube is located in the area enclosed by the annular space and surrounded by the liner tube. The openings in the hollow quartz glass liner tube enable the flow of cooling gas in the direction of the outside of the substrate tube.

For symmetrical and efficient cooling purposes, the openings may be positioned for flowing cooling gas around the circumference of the liner tube.

In another embodiment, the liner tube can be positioned such that the openings are positioned in the applicator slit for passing cooling gas from the interior of the elongated microwave guide through the applicator slit.

The means for directing a flow of cooling gas can include a mass flow controller for controlling the flow of cooling gas directed to the interior of the elongated microwave guide.

In one embodiment, the microwave guide can have a rectangular cross-section. In another embodiment, the microwave guide can have a circular cross-section.

In a further embodiment, provided herein is a method for manufacturing an optical fibre preform by means of a PCVD process, including the following steps:
i) carrying out a PCVD process for depositing one or more doped or undoped layers of silica on the interior surface of an elongated glass substrate tube, and
ii) subjecting the substrate tube to a thermal contraction treatment so as to form a solid preform, wherein the deposition takes place in the present device. A hollow substrate tube can be placed inside an area enclosed by an annular space such that the substrate tube and the annular space are substantially coaxial, and wherein the annular space is moved in a reciprocating manner along the length of the substrate tube so as to effect the deposition of one or more doped or undoped layers of silica on the interior of the substrate tube, wherein during the deposition a cooling gas is supplied to the interior of the annular space.

In a further embodiment, the cooling gas is supplied through the interior of the elongated microwave guide.

The cooling gas can be selected from the group including air, oxygen, nitrogen, carbon dioxide, and combinations thereof, preferably supplied as a gas having an over pressure of at least 0.1 bar.

The flow of cooling gas supplied to the interior can be such that the temperature prevailing at the outside of the glass substrate tube is lower than the melting temperature of the glass substrate tube.

In a further embodiment, the temperature prevailing at the outside of the glass substrate tube is the temperature of the glass substrate tube at a position near the applicator slit during the deposition process.

In a particular embodiment, the speed of the resonant cavity during the present deposition process can be below 300 mm/min under the conditions of a microwave power in the range of 3-10 kW and a flow rate of the cooling gas in the range of 25-250 slm.

In a further embodiment, a device for applying electromagnetic microwave radiation in a plasma inside a substrate tube is provided herein. The device includes spaced-apart inner and outer cylindrical walls defining an annular cavity therebetween, the inner cylindrical wall having a circumferential applicator slit extending in a full circle around the circumference of the inner cylindrical wall in a plane perpendicular to a cylindrical axis of the annular cavity, an elongate microwave guide arranged with a first end in communication with the annular cavity and a second end in communication with a microwave generating means such that microwaves are supplied from the microwave generating means to the annular cavity through the elongate microwave guide, and means for supplying a cooling gas through the elongate microwave guide to a position near the applicator slit.

In a further embodiment, the device includes a hollow liner tube arranged in an area enclosed by the annular cavity such that the hollow liner tube and the annular cavity are coaxially aligned, the hollow liner tube having a plurality of openings therethrough circumferentially arranged around a cylindrical axis of the hollow liner tube, the plurality of openings being laterally aligned with the circumferential applicator slit about the circumferential axis of the annular cavity.

BRIEF DESCRIPTION OF THE DRAWING

These and other features, aspects and advantages of the present invention are better understood when the following detailed description of the invention is read with reference to the accompanying drawing, in which:

FIG. 1 is a schematic diagram illustrating a device for applying electromagnetic microwave radiation in a plasma inside a hollow glass substrate tube in accordance with an embodiment of the invention.

DETAILED DESCRIPTION OF THE INVENTION

Referring to FIG. 1, an apparatus for carrying out a plasma chemical vapour deposition (PCVD) process is shown at reference numeral 7. The apparatus 7 is shown in cross-section for clarity. The apparatus 7 includes a cavity 6, which is substantially annular in shape, having an inner cylindrical wall 10 and an outer cylindrical wall 8. The inner cylindrical wall 10 has a slit 4, or circumferential void or opening through the inner cylindrical wall 10, that extends in a complete circle around the cylindrical axis in a plane perpendicular to the plane of the FIGURE. In the deposition process, a hollow quartz glass substrate tube is positioned in the area enclosed/defined by the annular space. Because deposition of glass layers occurs in the vicinity of the plasma zone, cavity 6 (and thus the plasma zone) is moved along the cylindrical axis so as to coat the glass substrate tube (not shown) uniformly along the entire length thereof.

An elongated microwave guide 2 is arranged with its first end 11 connected to the device 7 to provide an input port, and with its second end 12 connected to microwave generating means, such as a magnetron or a klystron (not shown) for supplying microwaves to the elongated microwave guide 2, such that microwaves travel to find their way into device 7 to generate a plasma zone in the interior of the glass substrate tube (not shown) at a position surrounded by cavity 6. The plasma zone formed creates conditions such that the glass-forming precursors supplied to the interior of the substrate tube deposit on the inner wall of the substrate tube to form one or more glass layers on the interior of the substrate tube.

A hollow liner tube 3 is arranged in the annular space 5 of cavity 6. The outer circumference of the liner tube 3 abuts against the inner cylindrical wall 10 of device 7. The liner tube 3 is provided with a plurality of openings 9 circumferentially arranged around the circumference of the liner tube at the location of the slit 4. In this arrangement, the slit 4 and the plurality of openings are aligned such that the plurality of openings 9 open to the cavity 6. A cooling gas is supplied via the elongated microwave guide 2. The flow of cooling gas can be controlled by a mass flow controller (not shown). The supply of cooling gas, indicated by arrow 1 located near the second end 12, flows through the interior of the elongated wave guide 2 and to the outside of the substrate tube positioned in the interior of the annular space of cavity 6. Although the supply of cooling gas is shown in the vicinity of the second side 12 in FIG. 1, the point of introduction of the cooling gas into the elongated wave guide 2 is not limited to the position shown in FIG. 1. In alternative arrangements, the position of the supply of cooling gas can be located closer to the first end 11 of the elongated microwave guide 2.

During the deposition process, the hollow substrate tube is surrounded by the liner tube 3, and the outer circumference of the liner tube 3 abuts against the inner cylindrical wall 10 of device 7. The supply of cooling gas at a position near the applicator slit 4 prevents the premature collapse of the substrate tube during the deposition process. During the inside deposition process, the substrate tube is positioned in the annular space, and the device 7 is reciprocated over the length of the substrate tube between a reversal point at the gas or inlet side, and a reversal point at the pump or outlet side. Glass forming precursors are supplied to the interior of the substrate tube. The microwaves supplied to the cavity 6 create plasma conditions and glass layers are deposited on the interior wall of the hollow substrate tube.

After the deposition process, the substrate tube is collapsed into a massive solid form. The obtained massive solid form can be provided additionally with one or more glass layers on the outside of the massive solid form. The final preform is placed in a draw tower and, due to the heating of one of its ends, a glass fibre is drawn and wound on a reel.

The invention claimed is:

1. A method for manufacturing an optical preform by means of a plasma chemical vapour deposition process, the method comprising the steps of:
   providing a device for applying electromagnetic microwave radiation in a plasma inside a substrate tube, the device comprising:
   i) spaced-apart inner and outer cylindrical walls defining an annular cavity therebetween, the inner cylindrical wall having a circumferential applicator slit extending in a full circle around the circumference of the inner cylindrical wall in a plane perpendicular to a cylindrical axis of the annular cavity;

ii) an elongate microwave guide arranged with a first end in communication with the annular cavity and a second end in communication with a microwave generating means such that microwaves are supplied from the microwave generating means to the annular cavity through the elongate microwave guide;

iii) means for supplying a cooling gas through the elongate microwave guide to a position near the applicator slit; and iv) a hollow glass substrate tube arranged in an area enclosed by the annular cavity such that the hollow liner tube and the annular cavity are coaxially aligned, the hollow liner tube having a plurality of openings therethrough circumferentially arranged around a cylindrical axis of the hollow liner tube, the plurality of openings being laterally aligned with the circumferential applicator slit about the circumferential axis of the annular cavity;

carrying out a plasma chemical vapour deposition process for depositing one or more doped or undoped layers of silica on the interior surface of the hollow substrate tube while supplying a cooling gas to the interior of the annular cavity using the means for supplying the cooling gas, wherein the cooling gas is supplied through the interior of the elongate microwave guide; and subjecting the substrate tube to a thermal contraction treatment so as to form a solid preform.

2. The method according to claim 1, wherein the cooling gas is selected from the group consisting of air, nitrogen, oxygen, carbon dioxide, and combinations thereof.

3. The method according to claim 1, wherein the cooling gas is supplied under an over pressure of at least 0.1 bar.

4. The method according to claim 1, wherein the cooling gas supplied to the interior of the annular cavity is such that a temperature prevailing at an outside of the substrate tube is lower than a melting temperature of the substrate tube.

5. The method according to claim 1, wherein a temperature prevailing at an outside of the substrate tube is the temperature of the substrate tube at a position near the applicator slit during the deposition process.

6. The method according to claim 1, wherein a reciprocating speed of the annular cavity during the deposition process is less than 300 mm/min with a microwave power from 3-10 kW and a flow rate of cooling gas from 25-250 slm.

* * * * *